US008625298B2

(12) United States Patent
Hankofer et al.

(10) Patent No.: US 8,625,298 B2
(45) Date of Patent: Jan. 7, 2014

(54) PROTECTION FOR CIRCUIT BOARDS

(71) Applicant: Infineon Technologies AG, Munich (DE)

(72) Inventors: Johannes Hankofer, Aiterhofen (DE); Manfred Mengel, Bad Abbach (DE); Stephan Schaecher, Munich (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 13/651,709

(22) Filed: Oct. 15, 2012

(65) Prior Publication Data

US 2013/0063916 A1  Mar. 14, 2013

Related U.S. Application Data

(62) Division of application No. 11/673,253, filed on Feb. 9, 2007, now abandoned.

(51) Int. Cl.
*H05K 7/00* (2006.01)

(52) U.S. Cl.
USPC ........... 361/760; 361/767; 361/763; 174/252; 174/260

(58) Field of Classification Search
USPC .................. 361/760, 767, 783; 174/252, 260
See application file for complete search history.

(56) References Cited

U.S. PATENT DOCUMENTS

| | | | |
|---|---|---|---|
| 5,060,261 A | 10/1991 | Avenier et al. | |
| 5,132,875 A | 7/1992 | Plesinger | |
| 5,136,366 A | 8/1992 | Worp et al. | |
| 5,233,505 A | 8/1993 | Chang et al. | |
| RE34,794 E * | 11/1994 | Farnworth | 257/678 |
| 5,648,615 A * | 7/1997 | Jeske et al. | 73/756 |
| 6,023,098 A | 2/2000 | Higashiguchi et al. | |
| 6,209,403 B1 | 4/2001 | Chen et al. | |
| 6,233,339 B1 | 5/2001 | Kawano et al. | |
| 6,245,992 B1 | 6/2001 | Hou | |
| 6,273,339 B1 | 8/2001 | Tuttle et al. | |
| 6,355,316 B1 | 3/2002 | Miller et al. | |
| 6,709,891 B2 | 3/2004 | Crane, Jr. et al. | |
| 6,850,607 B2 | 2/2005 | Meyer et al. | |
| 6,894,501 B1 | 5/2005 | Flasck et al. | |
| 6,957,345 B2 | 10/2005 | Cesana et al. | |
| 7,039,815 B1 | 5/2006 | Grassl et al. | |

(Continued)

FOREIGN PATENT DOCUMENTS

| | | |
|---|---|---|
| CN | 2397605 | 9/2000 |
| CN | 1596470 | 3/2005 |
| DE | 19512266 | 3/1996 |
| DE | 20112350 | 2/2002 |

(Continued)

OTHER PUBLICATIONS

Final Office Action in U.S. Appl. No. 11/745,220, dated Jun. 9, 2011.

(Continued)

*Primary Examiner* — Timothy Thompson
*Assistant Examiner* — Andargie M Aychillhum
(74) *Attorney, Agent, or Firm* — Banner & Witcoff, Ltd.

(57) ABSTRACT

A system has a circuit board, an integrated circuit being mounted on the circuit board by external contacts, and a cover irreversibly connected to the circuit board. The cover covers the external contacts so that external access to the external contacts is prohibited by the cover.

30 Claims, 9 Drawing Sheets

(56) References Cited

U.S. PATENT DOCUMENTS

| | | |
|---|---|---|
| 7,199,653 B2 | 4/2007 | Miyata |
| 7,309,907 B2 | 12/2007 | De Jongh et al. |
| 7,663,215 B2 | 2/2010 | Tuominen et al. |
| 2003/0132777 A1 | 7/2003 | Laackmann et al. |
| 2003/0150276 A1 | 8/2003 | Christensen et al. |
| 2005/0081049 A1 | 4/2005 | Nakayama et al. |
| 2006/0049941 A1 | 3/2006 | Hunter et al. |
| 2006/0148317 A1* | 7/2006 | Akaike et al. ............ 439/607 |
| 2006/0163707 A1 | 7/2006 | Hooi |
| 2006/0259788 A1 | 11/2006 | Elbert et al. |
| 2007/0151358 A1 | 7/2007 | Chien et al. |
| 2007/0162759 A1 | 7/2007 | Buskey et al. |
| 2007/0190846 A1 | 8/2007 | Yamashita et al. |
| 2007/0226807 A1 | 9/2007 | Ginter et al. |
| 2008/0001741 A1 | 1/2008 | Cobianu et al. |

FOREIGN PATENT DOCUMENTS

| | | |
|---|---|---|
| DE | 102006010284 | 3/2007 |
| EP | 0417648 | 3/1991 |
| EP | 1054316 | 5/1999 |
| EP | 1089219 | 4/2001 |
| EP | 1478018 | 11/2004 |
| JP | 05190771 | 7/1993 |
| WO | 2005098950 | 10/2005 |
| WO | 2007041575 | 4/2007 |

OTHER PUBLICATIONS

Non-Final Office Action in U.S. Appl. No. 11/745,220, dated Dec. 27, 2010.

German Office Action for DE 10 2008 018 221.4-33 dated Sep. 8, 2009.

* cited by examiner

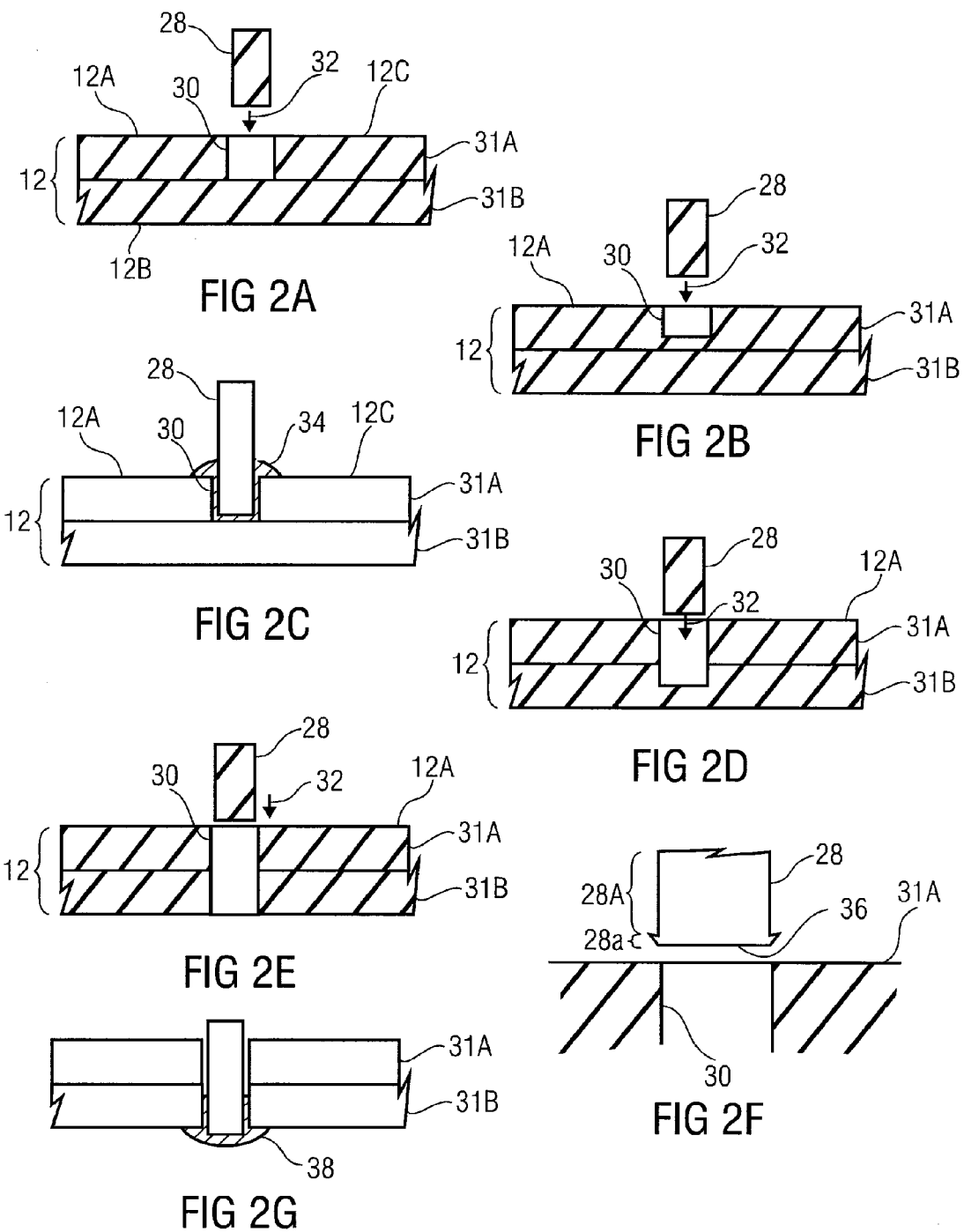

PROTECTION FOR CIRCUIT BOARDS

The present application is a divisional of U.S. patent application Ser. No. 11/673,253, filed Feb. 9, 2007, and entitled "Protection for Circuit Boards," hereby incorporated by reference as to its entirety.

TECHNICAL FIELD

The present invention relates to a protection for circuit boards against tampering.

BACKGROUND

In some applications, it would be favourable to be able to prevent circuit boards from abuse. For example, there is a need to protect the information in ICs in any business model where a IC containing device is given to the consumer at a reduced price with the obligation to use that device only with services from a certain provider. One already existing example for this kind of business model is the Simlock Cellphone® where the device is programmed to be only functioning using the Simcard from a specific provider. Similar need for protection exists for pay-per-use business models or receiving content over mass distributed channels, e.g. Cable and Satellite Pay TV.

BRIEF DESCRIPTION OF THE DRAWINGS

Referring to the figures, embodiments are described in more detail below. In particular

FIGS. 2a to 2g show sectional views of an anchoring pin of a protective cap acting as a cover, as shown in FIG. 1 and a corresponding hole in the circuit board, according to various embodiments;

FIGS. 3b and 3c show side and bottom views of the protective cap of FIG. 3a;

DETAILED DESCRIPTION

In the following description, same elements or elements corresponding to each other in terms of functionality are given the same reference numbers, and a repetitive description of same is avoided.

Figure 1:
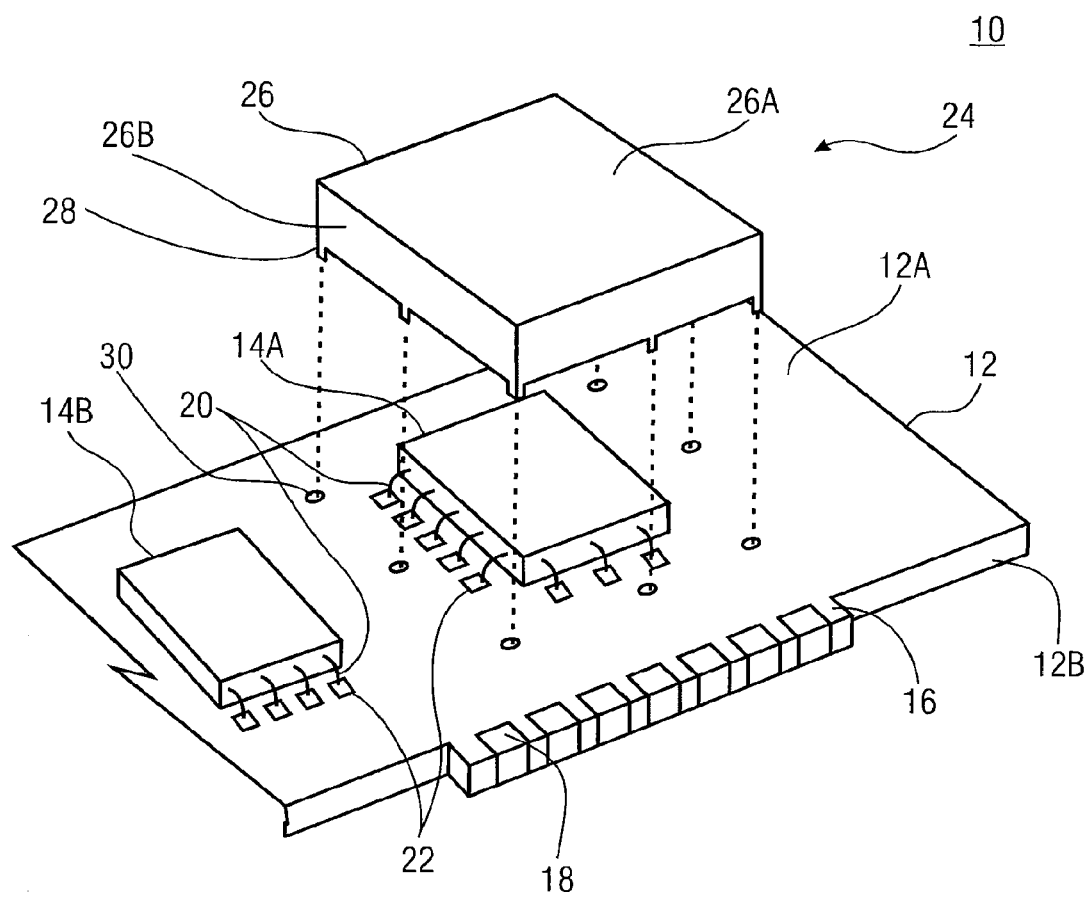
FIG. 1 shows a perspective view of a circuit board with a protection according to one embodiment.

FIG. 1 shows a system 10 comprising a circuit board 12 having several integrated circuits 14a, 14b mounted thereon and comprising a plug portion 16 at a circumferential portion of the circuit board 12. The plug portion 16 has external electrodes 18 formed thereon so as to form an external interface to an external device such as the motherboard of a computer, when the circuit board 12 has been plugged into a respective slot (not shown).

Integrated circuits 14a, 14b are mounted onto a mounting surface 12a of the circuit board 12. A surface 12b of the circuit board 12 being opposed to the mounting surface 12a may, or may not serve as a mounting surface for further integrated circuits (not shown) as well.

Exemplarily, merely two integrated circuits 14a, 14b are shown in FIG. 1 as being mounted to the circuit board 12. However, additional integrated circuits may be mounted to the circuit board 12 in a portion of the circuit board 12 not shown in FIG. 1. Alternatively, merely integrated circuit 14a may be mounted on the circuit board 12.

In FIG. 1, the integrated circuits 14a, 14b are shown as packaged chips being directly mounted onto the circuit board 12 via external contacts 20. However, as will be shown in the following embodiments, it is also possible that an integrated circuit is part of a chip module comprising a chip support substrate having one or several chips with an integrated circuit mounted thereon on a first side, and having external contacts for a connection to the circuit board 12 on an opposing surface. Similarly, although the external contacts 20 are shown as conductor legs extending from a side surface of the integrated circuit 14a, 14b, same could also be implemented as terminal pads on a mounting surface of the integrated circuit 14a, 14b defining the footprint thereof and facing the mounting surface 12a of the circuit board 12.

In particular, the integrated circuits 14a, 14b are mounted to the circuit board such that the external electrodes 20 thereof are electrically connected to contact pads 22 disposed on the mounting surface 12a of the circuit board 12. For example, the external contacts 20 are soldered to the contact pads 22. Alternatively, an electrically conductive adhesive may be used to achieve mechanical and electrical connection between the external contacts 20 and the contact pads 22.

The circuit board 12 comprises conductor lines interconnecting contact pads 22 and electrodes 18 so as to form an electrical circuit for performing a certain functionality. In FIG. 1, the circuit board 12 is exemplarily a multi-layer circuit board with conductor lines extending internally thereto, between the layers of the circuit board 12 and with through holes providing electrical contact between conductor lines, contact pads 22 and electrodes 18, respectively. However, as a precautionary measure only, it is noted that the present invention may also be applied to a circuit board 12 having conductor lines interconnecting the contact pads 22 disposed on the mounting surface 12a.

Among the integrated circuits 14a, 14b, integrated circuit 14b is, for example, a processor being able of executing computer programs running thereon. The integrated circuit 14a may comprise an encryption unit that participates in the cooperation of the integrated circuits 14a, 14b in connection with, for example, a functionality of interest of the circuit board 12, such that the functionality is not activateable or is defective, when the integrated circuit 14a has been removed. In this regard, the integrated circuit 14a should be protected as it is described in the following. Alternatively or additionally, the integrated circuit 14a could participate in the desired functionality of the circuit board 12 such that the data being transmitted via the external contacts 20 of the integrated circuit 14a should be protected from a spy out or a manipulation from outside. Such data could, for example, relate to the duration of usage of the desired functionality of the circuit board 12 or other pay per use data. In this regard, the integrated circuit 14a could also be an integrated circuit that should be protected from outside. In the following, embodiments for providing this protection will be described. It should be noted that the encryption unit for the integrated circuit 14a may comprise an asymmetric or a symmetric encryption unit. For example, the integrated circuit 14a may implement a RSA or an elliptic curve algorithm. Alternatively, the integrated circuit 14a may implement an AES, DES, or Triple-DES algorithm.

As a protection means, the system 10 of FIG. 1 comprises a cover 24 connected to the circuit board and covering, for example, at least the external contents 20 against a manipulation of the data communicated via the external contacts 20. In FIG. 1, the cover 24 comprises a protective cap 26 comprising a top surface 26a and a sidewall 26b. As shown in the exploded view of FIG. 1, the protective cap 26 is affixed to the circuit board, such that the sidewalls 26b encircle the integrated circuit 14a including the external contacts 20 and the contact pads 22 of the circuit board 12 to which they are connected, and such that the integrated circuit 14a is enclosed by the protective cap 26 and the circuit board 12, and any external access to the external contacts 20 is prohibited by the protective cap 26. In particular, as shown in FIG. 1, the protective cap 26 comprises anchoring pins 28 extending through respective holes 30 in the circuit board 12, so as to support or provide for the affixation of the protective cap 26 to the circuit board 12. The protective cap 26 may be affixed to the circuit board such that the protective cap 26 is electrically isolated from any conductive part of the circuit board 12 such as from the conductor lines, the contact pads 22, and the electrodes 18.

As will be described in more detail below, the cover 24 will not necessarily have to be implemented as a protective cap 26 having anchoring pins 28. However, preferably, the cover 24 is affixed to the circuit board 12 in an irreversible fashion, i.e. such that it is not possible to remove the cover 24, without destroying the circuitry of the circuit board 12, including the integrated circuits 14a, 14b, and the conductor lines interconnecting the contact pads 22. Even more preferably, the relationship between the labour necessary to remove the cover 24 from the circuit board 12 and the damage to the circuitry of the circuit board 12 resulting therefrom should be such, that the costs for the removal and the repair exceed a prospective gain associated with the removal due to, for example, the manipulation of the pay per use data communicated to the integrated circuit 14a.

In FIGS. 2a to 2e, various embodiments for a pair of a hole 30 and a respective pin 28 are shown, so as to illustrate how this pair of hole 30 and anchoring pin 28 may contribute to, or provide for the "irreversible" affixation of the protective cap to the circuit board 12. In these figures, the circuit board 12 is exemplarily shown as a two-layer board comprising a first layer 31a and a second layer 31b. In the embodiment of FIG. 2a, hole 30 is a blind hole extending from mounting surface 12a to an interface 12c between layer 31a and 31b. Preferably, a cross-section of the anchoring pin 28 is adapted to a cross-section of hole 30 such, that the anchoring pin 28 is stuck in hole 30, as illustrated by arrow 32. The mechanical removal of anchoring pin 28 out of hole 30 should exert sufficient force on the circuit board 12 to destroy the circuitry of the circuit board 12, such as, for example, interrupt conductor lines interconnecting contact pads 22.

As shown in FIG. 2b, the length of the blind hole 30 may be shorter. In accordance with FIG. 2b the blind hole 30 extends from mounting surface 12a to a portion of the first layer 31a from the mounting surface 12a, the portion being internal to this layer 31a.

As shown in FIG. 2c it is possible that the anchoring pin 28 is held in the blind hole 30 by means of an adhesive 34. To this end, for example, adhesive 34 is filled into the blind hole 30 before inserting anchoring pin 28 into blind hole 30, whereby some of the adhesive 34 is eventually displaced from blind hole 30 as illustrated in FIG. 2c. Thereafter, a curing of the adhesive 34 could take place. For instance, the adhesive is selected such that it hardens by way of an irreversible hardening process in contrast to, for example, solder which is reversibly releasable by heating same to above its melting temperature.

Preferably, the adhesive 34 is selected such that same results in a stable mechanical connection between anchoring pin 28 and circuit board 12, so as to guarantee an irreversible anchoring of pin 28 in hole 30. Moreover, adhesive 34 is preferably selected such that same, in its hardened state, is substantially chemical inert. That is, adhesive 34 should withstand chemical substances, such as etch solutions and the like, at least to the extent that removing the adhesive 34 to release anchoring pin 28 from hole 30 unavoidably leads to a destruction of the circuitry implemented on circuit board 12 by, for example, interrupting conductor lines of the circuit board 12 connecting some of the contact pads 22.

As shown in FIG. 2d, it is also possible that hole 30 is a blind hole extending from mounting surface 12a beyond the interface between layers 31a and 31b.

As shown in FIG. 2e, hole 30 could even be a through hole extending from mounting surface 12a to the opposing surface 12b of the circuit board 12.

As shown in FIG. 2f, in other to support the irreversible insertion of the anchoring pin 28 in hole 30, the distal end 38 of the anchoring pin 28 could be formed as a portion 28a having a greater diameter than a remaining proximal portion 28b of the anchoring pin 28. This could be achieved by, for example, mechanically deforming the distal end 36 of anchoring pin 28. Then, the anchoring pin 28 is inserted into hole 30. The larger diameter portion 28a enlarges the forces necessary in order to remove anchoring pin 28 out of hole 30, thereby increasing the likelihood that the circuit board 12 and its circuitry respectively, are destroyed by this removal.

As shown in FIG. 2g, it is also possible that, in case of hole 30 being a through hole, the securing of the anchoring pin 28 in hole 30 could be achieved from the opposing surface 12b by, for example, solder 38 in case of the anchoring pin 28 being of metal.

It should be noted that the material of the protective cap 26 could be chosen from, for example, metal, ceramic, glass or plastic. In any case, it is preferred that the protective cap shows a high resistance against sawing, rasping, mechanical shocks and the like. Thus, it should be stable, and rigid without being brittle. Moreover, the material should be chemically inert so that a chemical attack on the protective cap 26 is likely to result in a destruction of the circuitry of the circuit board 12. For example, in order to achieve access to manipulate data on external contacts 20 of integrated circuit 14a, a potential attacker has to remove the protective cap 26. However, since the sidewall 26b of the protective cap is anchored in circuit board 12, this removal will unavoidably or will likely lead to a destruction of the circuit board 12 such that same is rendered useless. For example, in case of the material of the protective cap 26 being steel or an $Al_2O_3$ ceramic or a highly-filled epoxy resin, a removal of the protective cap 26 by means of chemical substances such as solvents, acids and bases is not possible without concurrently etching away the conductor lines of the circuit board 12, rendering the circuit board 12 useless. An attempt to mechanically achieve access to the external contacts 20 for manipulation such as, for example, by means of a polishing or milling attack, leads to tension and shearing stresses on the anchoring surface of the protective cap 26 within the circuit board material what, in turn, damages the conductor lines of the circuit board 12a such that, again, the board 12 becomes useless.

Figure 3A:
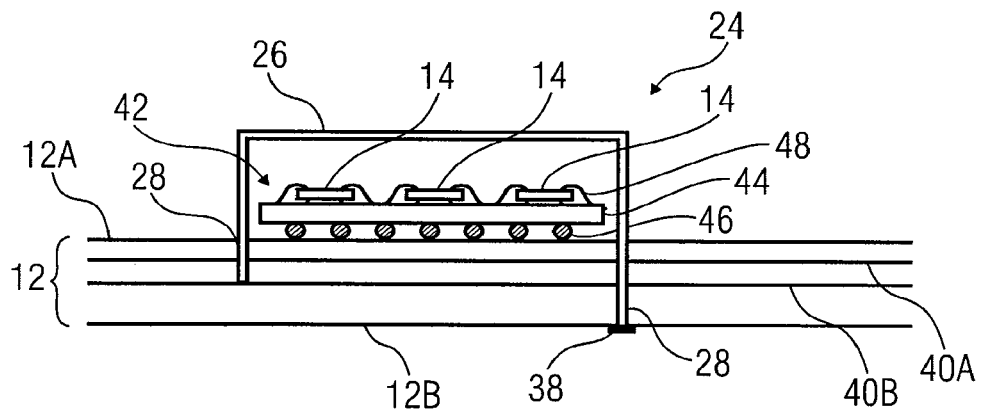
FIG. 3a shows a sectional side view of an arrangement of protective cap, chip module, and circuit board, according to another embodiment.

Reference is now made to FIG. 3a. FIG. 3a shows a part of a circuit board 12 with two exemplarily shown conductor lines 40a and 40b extending internally to the circuit board 12. A chip module 42 comprising a chip support 44 having chips 14 mounted thereon, is mounted to the circuit board by means of solder connections such as solder bumps 46. In particular, external contacts of the chips 14 are electrically connected to the solder connections 46 via bond wires 48 and conductor paths (not shown) of the chip support, thereby connecting the chips 14 with some of the conductor lines of the circuit board which could be, but not necessarily, the conductor lines 40a and 40b of the circuit board 12 shown in FIG. 3a.

In the embodiment of FIG. 3a, the cover 24 also comprises a protective cap 26, as it was the case in FIG. 1. Moreover, the protective cap 26 also comprises anchoring pins 28 extending into circuit board 12. However, according to the embodiment of FIG. 3a, one of the anchoring pins 28 only partially extends into the circuit board 12, whereas the other anchoring pin 28 solely extends from the mounting surface 12a through the circuit board 12 to the opposing surface 12b, where the distal end of this anchoring pin is anchored to the circuit board 12 by means of solder 38. In other words, the circuit board 12 of FIG. 3a has a through hole for allowing one of the anchoring pins 28 to pass through the circuit board 12 to the opposing surface 12b, and a blind hole extending from the mounting surface 12a to a plane of the circuit board 12 where one 40a of the conductor lines laterally extends internally to the circuit board 12.

Figure 3B:
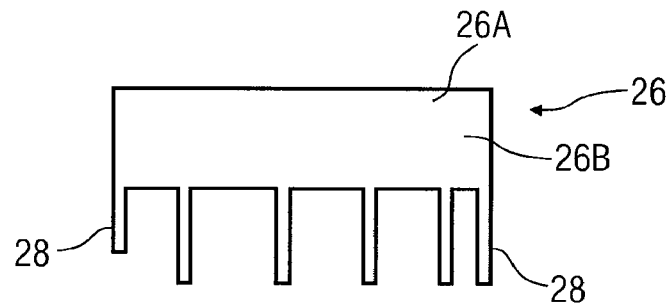
Figure 3C:
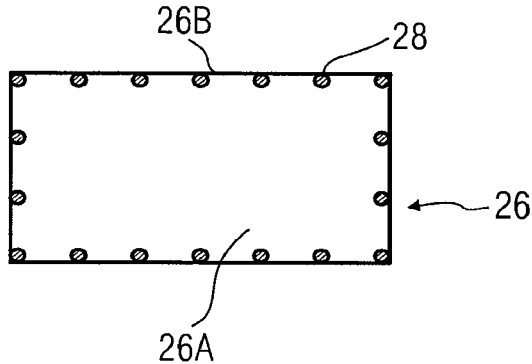

In FIGS. 3b and 3c, an example of the protective cap 26 is shown in more detail. As shown therein, the incoming pins 28 could have a round or circular cross-sectional shape. Moreover, the incoming pins 28 could be an integral part of the protective cap 26. For example, the protective cap 26 of FIGS. 3a to 3c is made of thin steel and, in its anchored state, protectively surrounds the multi-chip module 42 from the outside like a cave.

As illustrated by the left hand anchoring pin 28 in FIG. 3a, an anchoring pin may abut to one of the conductor lines to be mechanically and, eventually, electrically connected therewith. The latter connection could be achieved by, for example, an adhesive as shown in FIG. 2c, or solder. In other words, the circuit board 12 could have a blind hole at which one of the conductor lines 40b is exposed, and in to which the anchoring pin 28 is to be inserted.

It should be noted that the sensitivity of the anchoring surface against mechanical stress is adjustable via the geometric parameter of the pin diameter, the distance of the anchoring pin to a respective conductor line as well as material selected. In this regard, a diameter of the anchoring pin is preferably greater than 0.1 times the thickness of the circuit board. A possible arrangement of the holes relative to the conductor lines will be exemplarily discussed in more detail with regard to FIGS. 5a and 5b.

Figure 4A:
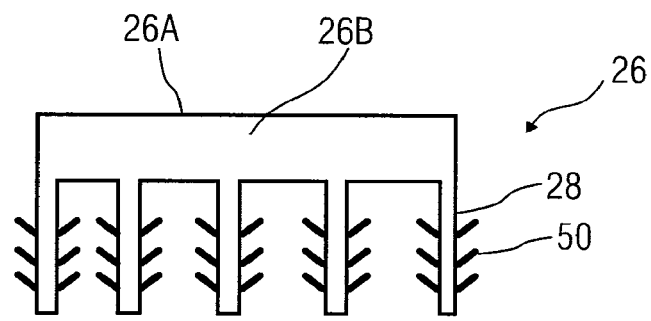
FIG. 4a shows a side view of a protective cap according to another embodiment.
Figure 4B:
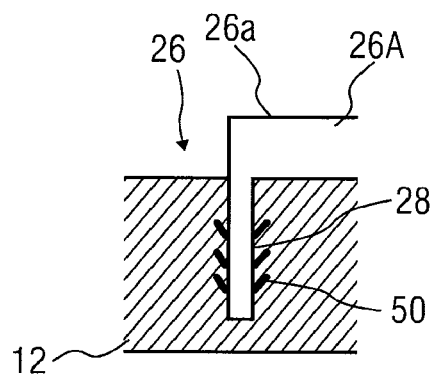
FIG. 4b shows a partial view of an anchoring pin of the protective cap of FIG. 4a in an affixed state.

However, prior thereto, FIGS. 4a and 4b show an example of a protective cap 26 comprising anchoring pins 28 according to which the anchoring pins 28 have a roughened outer surface or anchoring surface thereby forming hook portions which achieve an increased stability of adhesion to the circuit board 12, when inserted into same, as shown in FIG. 4b. As shown in FIG. 4b which shows the state in which the protective cap has been affixed to the circuit board 12, the insertion of the anchoring pin 28 into a hole of the circuit board 12 will tend to put the hook portions 50 against the side surface of the anchoring pin 28. Nevertheless, the hook portions 50 will increase the force necessary in order to remove the anchoring pin 28 out of the circuit board 12, preferably such that the removal unavoidably leads to the destruction of the circuit board 12.

Figure 5A:
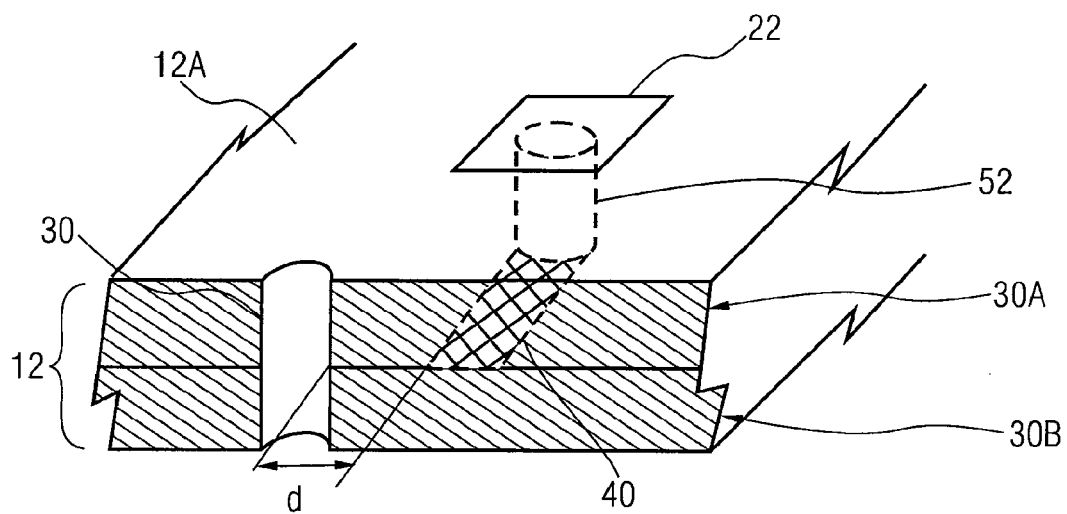
FIG. 5a shows a perspective sectional view of a circuit board for illustrating a possible placement of an anchoring pin hole relative to a conductor line of the circuit board.
Figure 5B:
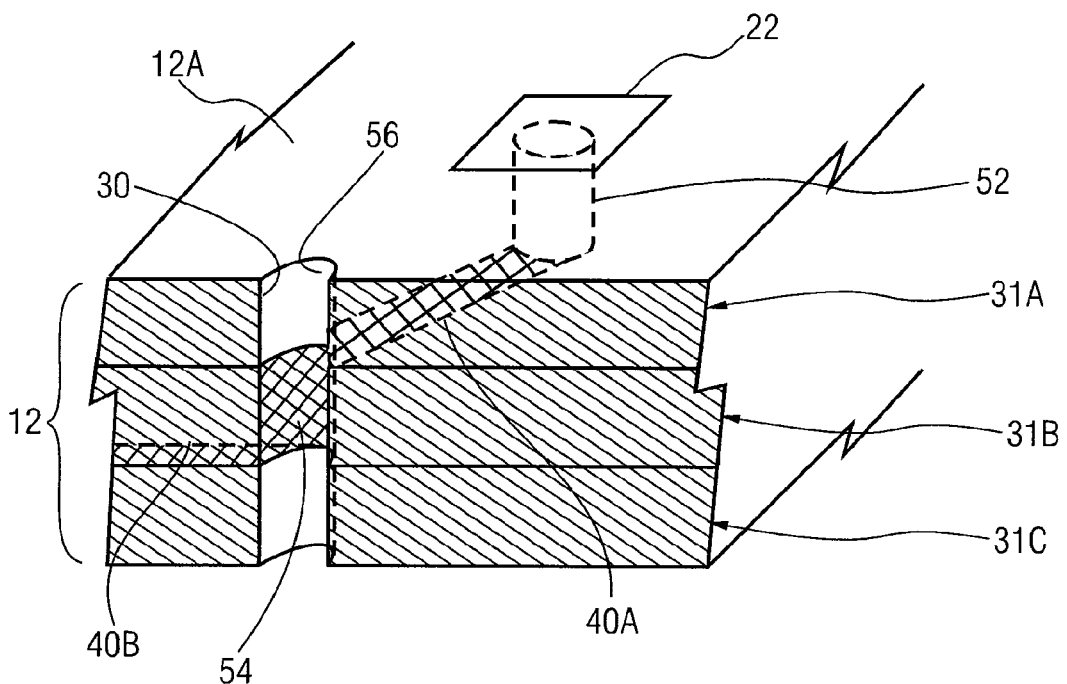
FIG. 5b shows a perspective sectional view of a circuit board for illustrating another possibility for the placement of an anchoring pin hole relative to a conductor line of the circuit board.

In connection with FIGS. 3a to 3c, it has already been noted that it is preferable that holes 30 or at least one hole in the circuit board is placed in the vicinity of or even borders on conductor lines of the circuit board, contributing to the circuitry of the circuit board. Examples for such placement are shown in FIGS. 5a and 5b. FIG. 5a shows a hole 30. In particular, hole 30 is shown as being a through hole. However, as already noted with regard to FIGS. 2a to 2g, hole 30 may also be a blind hole. FIG. 5a also shows a conductor line 40 running internally to the circuit board 12 in a plane between layers 31a and 31b. According to FIG. 5a, conductor line 40 is exemplarily connected to a contact pad 22 arranged on the mounting surface 12a through a via 52. The contact pad 22 may be one to which the integrated circuit 14a to be protected or the chip module 42 including the same, respectively, is mounted and thus is within the protected area within the cover 24. However, the contact pad 22 may also be one of the contact pads 22 not being covered by cover 24. Additionally, the conductor line 40 may not be connected directly to one of the contact pads, but merely via another conductor line of the circuit board 12. In any case, preferably, the conductor line 40 is part of the circuitry of the circuit board 12, such that a certain functionality of this circuit board 12 does not work if the conductor line 40 of FIG. 5a is interrupted.

In accordance with FIG. 5a, hole 30 is placed in the vicinity of conductor line 40. The lateral distance d is preferably smaller than 1 mm and even more preferably smaller than 100 μm, so as to guarantee the interruption of conductor line 40 in case of a removal of the anchoring pin (not shown in FIG. 5a) inserted into hole 30. As already noted above, distance d could even vanish, such that hole 30 borders the conductor line 40. In case of an electrically conductive anchoring pin, a conductor line 40 could even have a discontinuity at the location of the hole 30, with the discontinuity being bridged by the anchoring pin inserted into hole 30.

FIG. 5b shows an example where the circuit board 12 is a three-layer circuit board composed of three layers 31a, 31b, and 31c, wherein a part 54 of hole 30 extending through the middle layer 31b serves as a via connecting a first conductor line 40a running in a plane between layers 31a and 31b, and a conductor line 40b running in a plane between layers 31c and 31b. As illustrated in FIG. 5b, it is possible that the inner wall 56 in at least portion 54 is, covered with a conductive film connecting both conductor lines 40a and 40b prior to inserting the anchoring pin (not shown in FIG. 5b) into hole 30. Alternatively or additionally, the anchoring pin 28 may be made of a conductive material and serve as an electrical connection between conductor lines 40a and 40b in the inserted state. By this measure, the conductor lines 40a and 40b are disconnected in case of the anchoring pin being removed from hole 30.

In the above embodiments, the protective cap had anchoring pins extending into the circuit board for irreversible affixation to the circuit board. In the following, with regard to FIGS. 6a to 6d, embodiments are described where the affixation of the protective cap to the circuit board is achieved by adhesive. In these embodiments no portion of the protective cap extends into the circuit board.

Figure 6A:
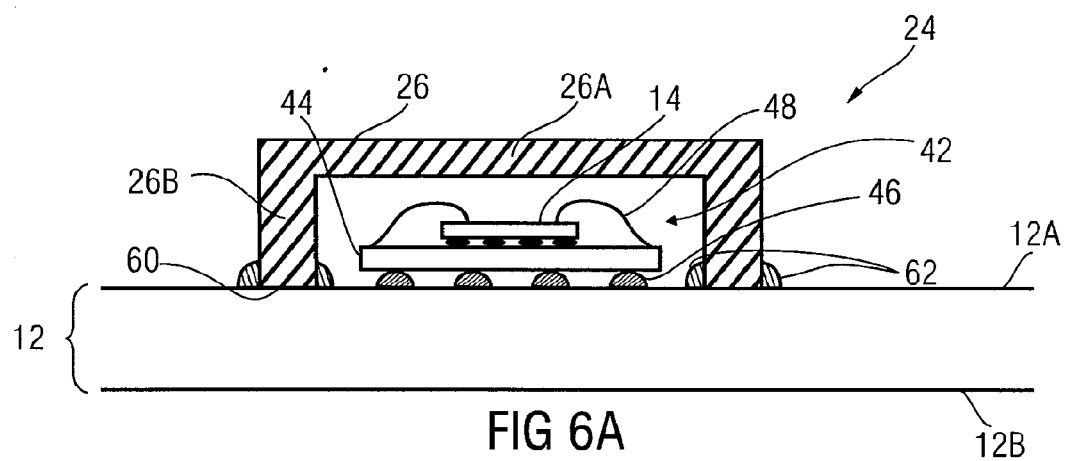
FIGS. 6a to 6d show sectional side views of an arrangement of a circuit board, an integrated circuit to be protected and a protective cap according to further embodiments.
Figure 6B:
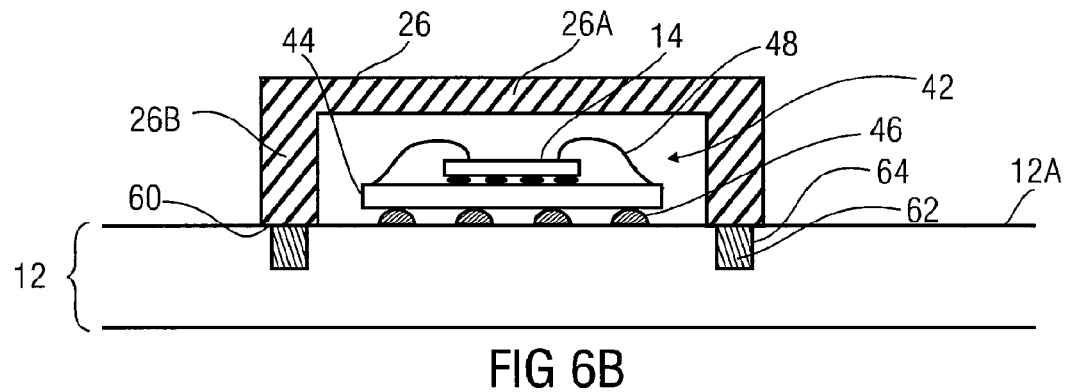

FIG. 6a shows an arrangement where a single chip module 42 is mounted to the mounting surface 12a of a circuit board 12. As described with respect to FIG. 3a, the chip module 42 comprises a chip support 44 supporting a chip 14 to be protected, the chip 14 being connected to conductor lines (not shown) of the circuit board 12 via bond wires 48 and solder connections 46. Instead of solder connections 46, electrically conductive adhesive may also be used.

In order to prohibit any external access to, for example, the bond wires 48 a cover 24 covers the whole chip module 42, as well as the contact pads (not shown), to which connections 46 are connected. As in the foregoing examples, cover 24 comprises a protective cap 26. However, no anchoring pin protrudes from the seat area 60 of cap 26 at the distal end of the sidewalls 26b facing circuit board 12. Rather, the seat area 60 of protective cap 26 abuts to the mounting surface 12a within a closed band thereof surrounding a mounting area of the chip module 42.

The protective cap 26 is affixed to the circuit board 121 by means of adhesive 62. As mentioned above with respect to adhesive 34 of FIG. 2c, adhesive 62 preferably provides a strong adhesion between cap 26 and circuit board 12, and shows preferably a high resistance towards chemical substances. In particular, the adhesive may be an irreversible hardening adhesive such as an irreversible hardening resin. Additionally, the protective cap 26 may be affixed to the circuit board such that the protective cap 26 is electrically isolated from any conductive part of the circuit board 12.

As described with respect to FIGS. 5a and 5b, it is preferred that conductor lines (not shown) of the circuit board 12 extending internally to the circuit board 12 are in the vicinity of the seat area 60 and, in particular, adhesive 62, both in terms of lateral distance and vertical depth. For example, in the case of a multi-layer substrate 12, conductor lines crossing seat areas 60 should run in interfaces between layers of the circuit board 12 nearest to, or at least near to mounting surface 12a, rather than opposing surface 12b, thereby increasing the likelihood of an interruption of these conductor lines in the case of removal of the protective cap 26 by force.

In the embodiment of FIG. 6a, the adhesive 62 is liable to an attack by means of chemical substances from outside. Therefore, in accordance with FIG. 6b, a recess 64 is formed in the mounting surface 12a so as to be overlapped by the seat area 60 of the protective cap 26 in the affixed state. The adhesive 62, affixing the protective cap 26 to the circuit board 12 is provided in the recess 64. By this measure, chemical substances for releasing the adhesion connection between the protective cap 26 and the circuit board 12 may not easily be brought into contact with adhesive 62.

Figure 6C:
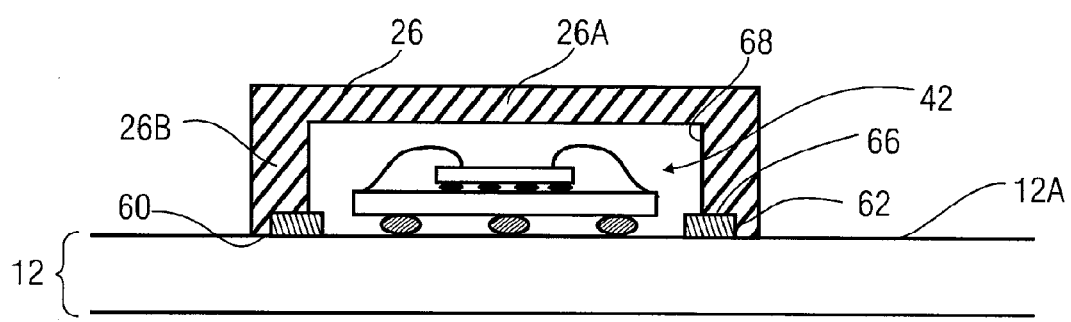

In accordance with the embodiment of FIG. 6c, compared to the embodiment of FIG. 6a, a recess or step 66 is formed in an edge between an inner surface 68 of the sidewall 26b and the seat area or seat surface 60, wherein the adhesive 62 is arranged in this recess 66 in order to provide for the mechanical connection between the protective cap 26 and the circuit board 12. Similar to the embodiment of FIG. 6b, the adhesive 62 arranged in recess 66 is protected against chemical attacks from outside.

Figure 6D:
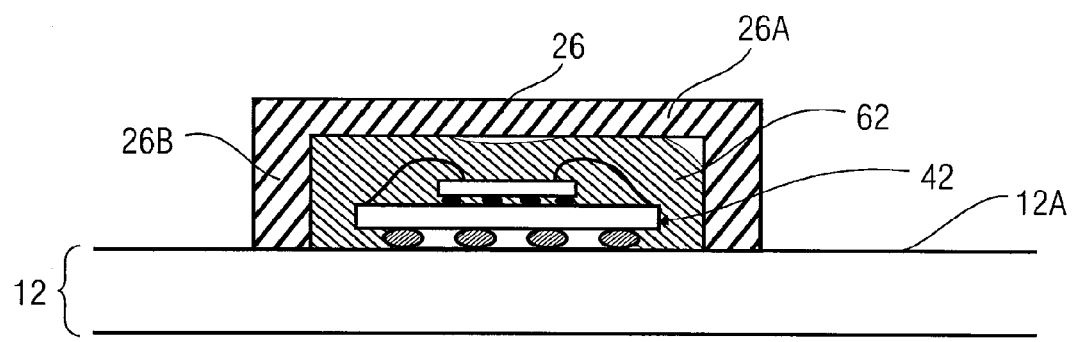

In accordance with the embodiment of FIG. 6d, the enclosed space between the protective cap 26 and the circuit board 12 is almost completely filled with the adhesive 62, the adhesive 62 contacting the inner surface 68 of sidewall 26b, the inner surface of ceiling 26a, as well as the portion of the mounting surface 12a encircled by seat area 60, thereby achieving the mechanical connection between the protective cap 26 and circuit board 12, and being, concurrently, protected against chemical attacks from outside.

Figure 7A:
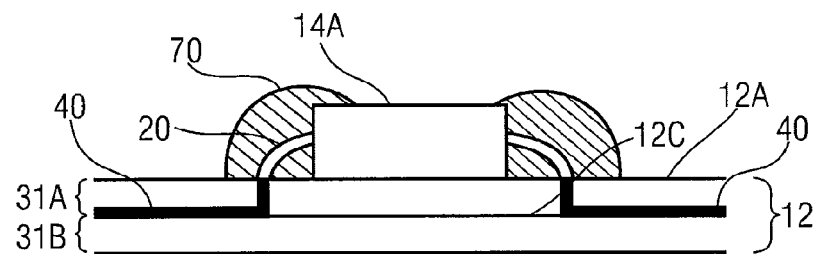
FIGS. 7a to 7d show sectional side views of an arrangement of a circuit board and an integrated circuit board mounted thereon, with a resin being provided for protection, according to further embodiments.

In the embodiments described above, cover 24 comprised a protective cap made up of, for example, metal, ceramics, glass, or plastic. Differing therefrom, in the embodiments of FIGS. 7a to 7d, a coverage of the externally accessible connection structure to connect the integrated circuit to be protected, such as the external contact 20, the bond wires 48 and the solder connections 46, respectively, is achieved by resin which is, for example, non-conductive. FIG. 7a shows, for example, an integrated circuit 14a being mounted on a mounting surface 12a of a circuit board 12, wherein the external contacts 20 of the integrated circuit 14a are completely covered by a resin 70 being disposed on the external contact 20. As shown in FIG. 7a, the resin 70 preferably not only completely covers the external contacts 20, but also adheres to mounting surface 12a as well as the outer surface of integrated circuit 14a. Accordingly, resin 70 may be an adhesive and could comply with the abovementioned requirements with respect to a strong adhesion and/or chemical resistance. Resin 70 prevents an external access to the external contacts 20 and guarantees that the circuit board 12 and its circuitry are destroyed upon a forcible removal of the resin 70.

Figure 7B:
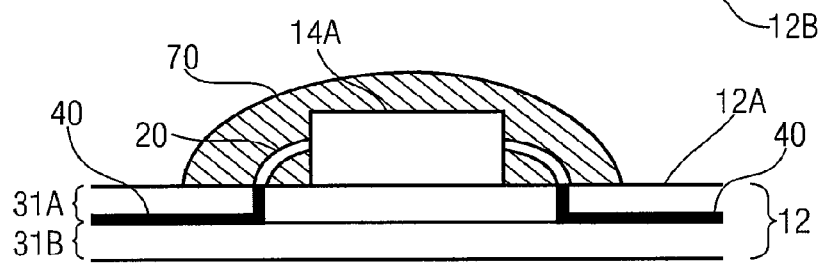

Differing from FIG. 7a where the disposal of resin 70 was restricted to portions through which the external contacts 20 extended, in the embodiment of FIG. 7b resin 70 is completely disposed over the whole integrated circuit 14a, including the external contacts 20, so as to cover both the integrated circuit 14a and the external contacts 20.

Figure 8:
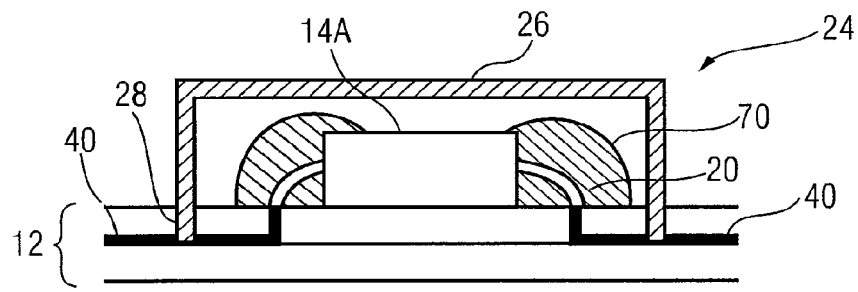
FIG. 8 shows a sectional side view of an arrangement of a circuit board and an integrated circuit mounted thereon with a protection comprising a protective cap and resin, according to another embodiment.
Figure 7C:
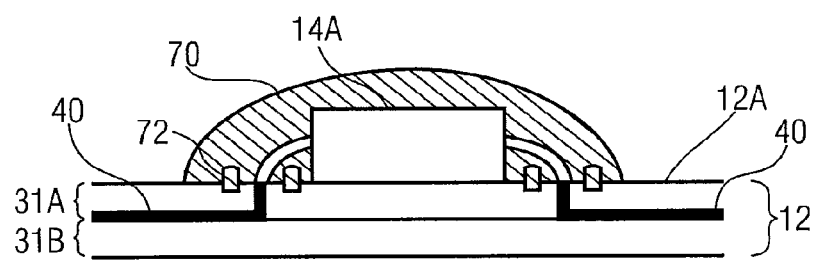
Figure 7D:
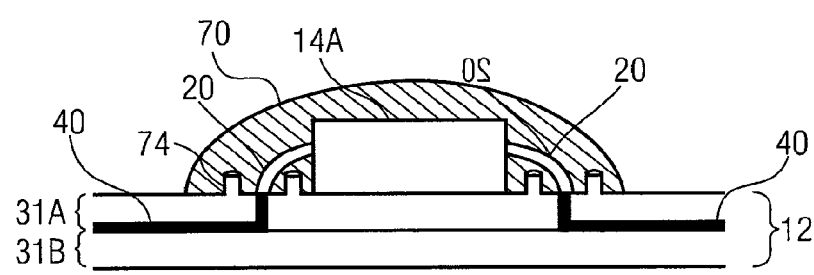

FIG. 7c shows recesses 72 formed in the mounting surface 12a of the circuit board 12, in an area where resin 70 adheres to the mounting surface 12a, in order to increase the adhesion force by which resin 70 is affixed to mounting surface 12a. Similarly, FIG. 7d shows protrusions 74 protruding from the mounting surface 12a in the area of the mounting surface 12a where resin 70 touches or adheres to mounting surface 12a so as to increase the adhesion force. Of course, it is possible to mix up protrusions 74 and recesses 72 in order increase the adhesion force, and/or to use just one protrusion/recess. Of course it is possible to combine the embodiments according to FIGS. 7a to 7d with any other of the aforementioned embodiments with respect to FIGS. 1 to 6d. FIG. 8, for example, shows a cover 24 comprising both a protective cap 26 of, for example, a rigid material as well as a resin 70 covering the external contacts 20, the protective cap 26 protecting or enclosing both the resin 70, as well as integrated circuit 14a. For example, the resin 70 may take up more than 50% of the space enclosed by the protective cap 26 and circuit board 12 and surrounding the integrated circuit 14a such that the resin 70 contacts the protective cap 26 from inside similar to FIG. 6d. In FIG. 8, the holes in the circuit board 12 for accommodating the anchoring pins 28 of the protective cap 26 abut to the internal conductor lines 40 of the circuit board 12, and the resin 70 does not completely cover the integrated circuit 14a. However, as already described above, these examples may be modified as indicated above.

Figure 9:
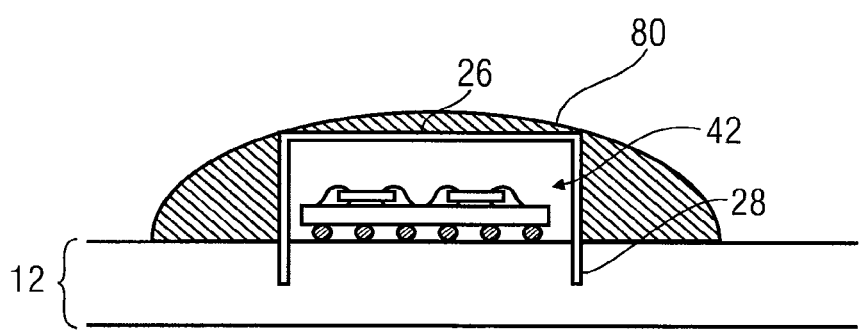
FIG. 9 shows a side view of a protective cap additionally covered by resin according to another embodiment.

The above-described embodiments may be modified in various ways. With respect to the embodiment of FIGS. 1 to 6d, for example, it is noted that the protective cap 26 itself may be completely covered by a stabilizing globe top 80, so as to avoid an unintentional destruction of the circuit board due to, for example, hitting the protective cap 26. This is shown in FIG. 9.

Figure 10:
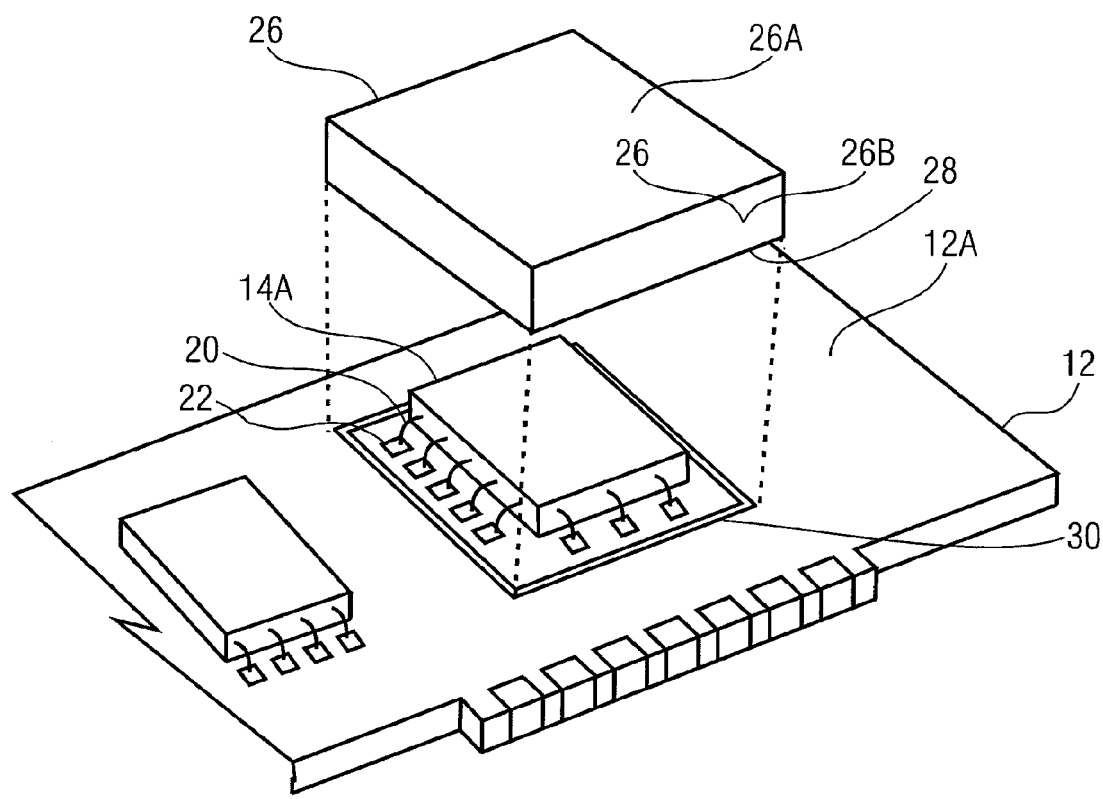
FIG. 10 shows a perspective view of a circuit board and its protection according to a further embodiment.

Moreover, with regard to FIG. 10, it is noted with respect to the embodiments of FIGS. 1 to 5b, that just one anchoring pin may be provided as well. The anchoring pins may also not necessarily have to have an aspect ratio according to which the vertical length, i.e. the length along which the anchoring pin is inserted into the hole, is greater than the greatest lateral extension of the anchoring pin. As it is shown in FIG. 10, for example, the distal end portion of the sidewall 26b itself may be used as an anchoring portion extending into the circuit board 12. To this end, a trench like hole 30 is formed in the mounting surface 12a of the circuit board 12, the trench like hole encircling the integrated circuit 14a including the external contacts 20 and the respective contact pads 22, so as to conform with the circumference or seat area of the sidewall 26b, and allow an insertion of the distal end portion as an anchoring portion 28 into hole 30.

In the description of the above embodiments, the description mostly related to the already assembled state. However, according to another embodiment, the aforementioned protective cap comprising the anchoring pin or portion, respectively, has not yet been inserted into the respective hole. Accordingly, the protective cap and circuit board form a kit. During a fabrication or a protection step, the already mounted integrated circuit may be protected by means of the protective cap with eventually, as described above, using adhesive or soldering. Moreover, various ways in order to dispose the aforementioned resin on top of the external contacts and/or the integrated circuit to be protected are possible.

In any case, the above embodiments prevent the portions where a manipulator may access the signals of interest to/from the integrated circuit, on the circuit board against being exposed by means of simple chemical or physical preparation. In particular, the above embodiments protect an integrated circuit or a chip module to the extent that a respective preparative attack for exposing the terminals of the integrated circuit either involves overheads or costs in an unattractive amount that exceeds the value of the computer system, or that such a preparative attack unavoidably leads to the destruction of the board surface, rendering the board useless. Thus, the above embodiments may be used to protect integrated circuit from removal from the circuit board without destroying the board. Thus, a device containing the integrated circuits may be given to a consumer at, for example, a reduced price with the obligation to use that device only with services from a certain provider. For example, the device including one of the above circuit boards could be programmed to be only functional using circuitry from a specific provider residing inside the integrated circuit 14a.

While the foregoing has been particularly described with reference to particular embodiments thereof, it will be understood by those skilled in the art that various other changes in the forms and details may be made without departing from the broader spirit and scope thereof. It is to be understood that various changes may be made in adapting to different embodiments without departing from the broad concept disclosed herein, and comprehended by the claims that follow.

REFERENCE SIGNS 10 system
12 circuit board
12a mounting surface
12b opposed surface
14a,b integrated circuits
16 plug portion
18 external electrodes
20 external contacts
22 contact pads
24 cover
26 protective cap
26a ceiling
26b side wall
28 anchoring pin
30 hole
31a,b layer
34 adhesive
36 distal end
38 solder
40 conductor line
42 chip module
44 chip support
46 solder bumps
48 bond wires
50 hook portions
52 via
54 part of hole
60 seat area
62 adhesive
64 recess
66 step
68 inner surface
70 resin
72 recess
74 protrusions
80 globe top

What is claimed is:

1. A system comprising
a circuit board;
an integrated circuit having an encrypting unit and being mounted on the circuit board by means of external contacts; and
a cover connected to the circuit board, the cover comprising a protective cap being affixed to the circuit board so that the integrated circuit is enclosed by the protective cap and the circuit board and external access to the external contacts is prohibited by the protective cap, wherein the protective cap is affixed to the circuit board by at least one anchoring portion extending into the circuit board, wherein the circuit board has a conductor line extending internally thereto, the conductor line being electrically connected to the external contact, and wherein the at least one anchoring portion extends into the circuit board so that the anchoring portion touches or extends at a distance to the conductor line of the circuit board, the distance between the at least one anchoring portion and the conductor line being less than 1 mm.

2. The system according to claim 1, wherein the protective cap is affixed to the circuit board by adhesive.

3. The system according to claim 1, wherein the cover also comprises a resin being disposed on the integrated circuit and/or the external contacts such that external access to the external contacts is prohibited by the resin.

4. A system, comprising:
a circuit board;
an integrated circuit being mounted on the circuit board by means of external contacts; and
a protective cap being affixed to the circuit board so that the integrated circuit is enclosed by the protective cap and the circuit board and external access to the external contacts is prohibited by the protective cap, wherein the protective cap is affixed to the circuit board by at least one of at least one anchoring portion extending into the circuit board, and an irreversibly hardening adhesive, wherein the at least one anchoring portion extends into the circuit board so that the anchoring portion touches or extends at a distance to a conductor line of the circuit board, the distance between the at least one anchoring portion and the conductor line being less than 1 mm.

5. The system according to claim 4, wherein the circuit board comprises conductor lines connected to the external contacts, the conductor lines extending internally to the circuit board.

6. The system according to claim 4, wherein the at least one anchoring portion protrudes from and is integrally part of the protective cap.

7. The system according to claim 4, wherein the conductor line of the circuit board is connected to the integrated circuit.

8. The system according to claim 4, wherein the conductor line of the circuit board is buried into the circuit board.

9. The system according to claim 4, wherein the anchoring portion is an anchoring pin, and a diameter of the anchoring pin is greater than 0.1 times the thickness of the circuit board.

10. The system according to claim 4, wherein the anchoring portion is an anchoring pin, and the anchoring pin comprises a smaller diameter portion and a larger diameter portion, a diameter of the anchoring pin in the smaller diameter portion being less than a diameter of the anchoring pin in the larger diameter portion, and the larger diameter portion being located at a distal location relative to the smaller diameter portion.

11. The system according to claim 4, wherein the at least one anchoring portion comprises a hook portion engaging with the circuit board so as to counteract a movement of the anchoring portion out of the circuit board.

12. The system according to claim 4, wherein the circuit board comprises at least one hole into which the anchoring portion is inserted.

13. The system according to claim 12, wherein the at least one hole is a through hole extending from a first surface of the circuit board onto which the integrated circuit is mounted to a second surface of the circuit board being opposite to the first surface.

14. The system according to claim 4, wherein the at least one anchoring portion is affixed to the circuit board by means of solder.

15. The system according to claim 4, wherein the at least one anchoring portion is affixed to the circuit board by means of adhesive.

16. The system according to claim 4, further comprising a resin being disposed on the integrated circuit and/or the external contacts such that external access to the external contacts is prohibited by the resin.

17. The system according to claim 16, wherein the integrated circuit and the resin are enclosed by the protective cap and the circuit board.

18. The system according to claim 17, wherein the resin covers an area of a surface of the circuit board surrounding the integrated circuit, wherein the circuit board comprises at least one recess or protrusion in the area of the surface of the circuit board surrounding the integrated circuit.

19. The system according to claim 18, wherein the resin takes up more than 50% of the space enclosed by the protective cap and circuit board and surrounding the integrated circuit such that the resin contacts the protective cap from inside.

20. The system according to claim 16, wherein the resin is non-conductive.

21. The system according to claim 4, wherein the protective cap is affixed to the circuit board by means of the adhesive, with a recess being formed in a portion of the circuit board facing a seat area of the protective cap or an edge of the protective cap formed between an inner wall of the protective cap and the seat area, and with the resin being at least partially disposed in the recess.

22. The system according to claim 4, wherein the protective cap is affixed to the circuit board such that the protective cap is electrically isolated from any conductive part of the circuit board.

23. The system according to claim 4, wherein the irreversibly hardening adhesive is a resin.

24. A kit comprising:
a circuit board comprising holes in an area surrounding a chip mounting area; and
a protective cap comprising anchoring pins such that the anchoring pins can be inserted into the holes to enable an affixation of the protective cap to the circuit board, wherein at least one of the holes extends into the circuit board so that same abuts to or extends at a distance to a conductor line of the circuit board, the distance between the at least one hole and the conductor line being less than 1 mm.

25. The kit according to claim 24, wherein the conductor line of the circuit board is connected to an integrated circuit mounting pad in the chip mounting area.

26. The system according to claim 24, wherein the conductor line of the circuit board is buried into the circuit board.

27. A method for protecting an integrated circuit, comprising affixing a protective cap to a circuit board onto which the circuit board is mounted such that the integrated circuit is enclosed by the protective cap and the circuit board, such that external access to the external contacts is prohibited by the protective cap, and such that the protective cap is affixed to the circuit board by at least one anchoring portion extending into the circuit board and abutting to or extending at a distance to a conductor line of the circuit board, the distance between the at least one anchoring portion and the conductor line being less than 1 mm.

28. The system according to claim 27, wherein the conductor line of the circuit board is connected to the integrated circuit.

29. The system according to claim 27, wherein the conductor line of the circuit board is buried into the circuit board.

30. A system, comprising:
a circuit board;
an integrated circuit being mounted on the circuit board by means of external contacts; and
a protective cap being affixed to the circuit board so that the integrated circuit is enclosed by the protective cap and the circuit board and external access to the external contacts is prohibited by the protective cap, wherein the protective cap is affixed to the circuit board by an irreversibly hardening adhesive,
wherein the system has at least one of the two following structures: (1) a recess formed in a portion of the circuit board facing a seat area of the protective cap, and (2) a step formed in an edge of the protective cap formed between an inner wall of the protective cap and the seat area, and wherein the irreversibly hardening adhesive is at least partially disposed in said at least one of the two structures.

* * * * *